(12) United States Patent
Li et al.

(10) Patent No.: US 11,239,373 B2
(45) Date of Patent: Feb. 1, 2022

(54) SEMICONDUCTOR DEVICE AND MANUFACTURING METHOD THEREOF

(71) Applicant: UNITED MICROELECTRONICS CORP., Hsin-Chu (TW)

(72) Inventors: Xiang Li, Singapore (SG); Ding-Lung Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 68 days.

(21) Appl. No.: 16/942,775

(22) Filed: Jul. 30, 2020

(65) Prior Publication Data
US 2021/0399133 A1 Dec. 23, 2021

(30) Foreign Application Priority Data
Jun. 18, 2020 (CN) .......................... 202010558034.8

(51) Int. Cl.
*H01L 29/786* (2006.01)
*H01L 29/66* (2006.01)

(52) U.S. Cl.
CPC .... *H01L 29/7869* (2013.01); *H01L 29/66742* (2013.01); *H01L 29/66787* (2013.01); *H01L 29/78642* (2013.01)

(58) Field of Classification Search
CPC ......... H01L 21/8232; H01L 21/823412; H01L 21/823418; H01L 21/823437; H01L 21/823456; H01L 21/823462; H01L 21/823475; H01L 21/823487; H01L 21/823807; H01L 21/823814; H01L 21/82385; H01L 21/823885; H01L 29/66007; H01L 29/66666; H01L 29/66742; H01L 29/66787; H01L 29/76; H01L 29/772; H01L 29/7827; H01L 29/7831; H01L 29/78642; H01L 29/7869; H01L 29/78696
See application file for complete search history.

(56) References Cited

U.S. PATENT DOCUMENTS 8,624,240 B2   1/2014  Sato
10,002,935 B2  6/2018  Sandhu

*Primary Examiner* — Cheung Lee
(74) *Attorney, Agent, or Firm* — Winston Hsu

(57) ABSTRACT

A semiconductor device includes a dielectric structure, a first source/drain electrode, a second source/drain electrode, an oxide semiconductor layer, a gate dielectric layer, and a first gate electrode. The first source/drain electrode is disposed in the dielectric structure. The oxide semiconductor layer is disposed on the first source/drain electrode in a vertical direction. The second source/drain electrode disposed on the oxide semiconductor layer in the vertical direction. The gate dielectric layer is disposed on the dielectric structure and surrounds the oxide semiconductor layer in a horizontal direction. The gate dielectric layer includes a first portion and a second portion. The first portion is elongated in the horizontal direction. The second portion is disposed on the first portion and elongated in the vertical direction. The first gate electrode is disposed on the first portion of the gate dielectric layer.

20 Claims, 17 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including an oxide semiconductor layer and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. The general semiconductor manufacturing process may be roughly divided into a front end of line (FEOL) process for forming transistors on a wafer and a back end of line (BEOL) process for forming parts such as contact structures, interlayer dielectric layers, interconnection structures, and contact pads above the transistors. However, many other active or passive devices are also designed to be formed by the BEOL process as the required integrity of the integrated circuits becomes higher and higher, the manufacturing processes become more complicated, and the manufacturing cost increases accordingly.

SUMMARY OF THE INVENTION

A semiconductor device and a manufacturing method thereof are provided in the present invention. Source/drain electrodes are disposed at two opposite sides of an oxide semiconductor layer in a vertical direction for simplifying the related manufacturing processes and/or reducing the manufacturing cost.

According to an embodiment of the present invention, a semiconductor device is provided. The semiconductor device includes a dielectric structure, a first source/drain electrode, a second source/drain electrode, an oxide semiconductor layer, a gate dielectric layer, and a first gate electrode. The first source/drain electrode is disposed in the dielectric structure. The oxide semiconductor layer is disposed on the first source/drain electrode in a vertical direction. The second source/drain electrode is disposed on the oxide semiconductor layer in the vertical direction. The gate dielectric layer is disposed on the dielectric structure and surrounds the oxide semiconductor layer in a horizontal direction. The gate dielectric layer includes a first portion and a second portion. The first portion is elongated in the horizontal direction. The second portion is disposed on the first portion and elongated in the vertical direction. The first gate electrode is disposed on the first portion of the gate dielectric layer.

According to an embodiment of the present invention, a manufacturing method of a semiconductor device is provided. The manufacturing method includes the following steps. A first source/drain electrode is formed in a dielectric structure. An oxide semiconductor layer is formed on the first source/drain electrode in a vertical direction. A gate dielectric layer is formed on the dielectric structure. The gate dielectric layer surrounds the oxide semiconductor layer in a horizontal direction, and the gate dielectric layer includes a first portion and a second portion. The first portion is elongated in the horizontal direction. The second portion is disposed on the first portion and elongated in the vertical direction. A first gate electrode is formed on the first portion of the gate dielectric layer. A second source/drain electrode is formed on the oxide semiconductor layer in the vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-13 are schematic drawings illustrating a manufacturing method of a semiconductor device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a top-view schematic drawing illustrating an area in FIG. 11, and FIG. 13 is a schematic drawing in a step subsequent to FIG. 11.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
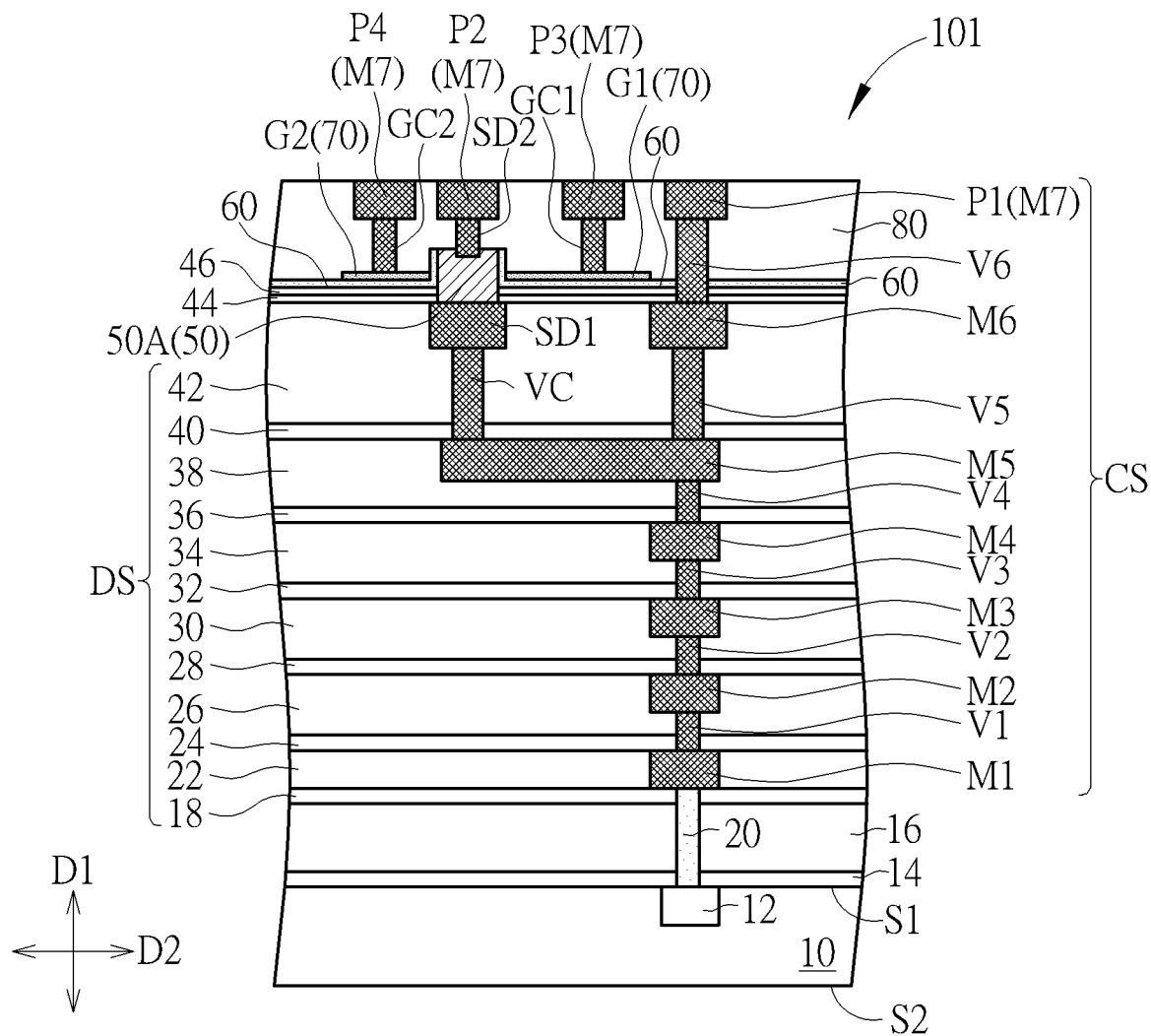
FIG. 1 is a schematic drawing illustrating a semiconductor device according to a first embodiment of the present invention.
Figure 2:
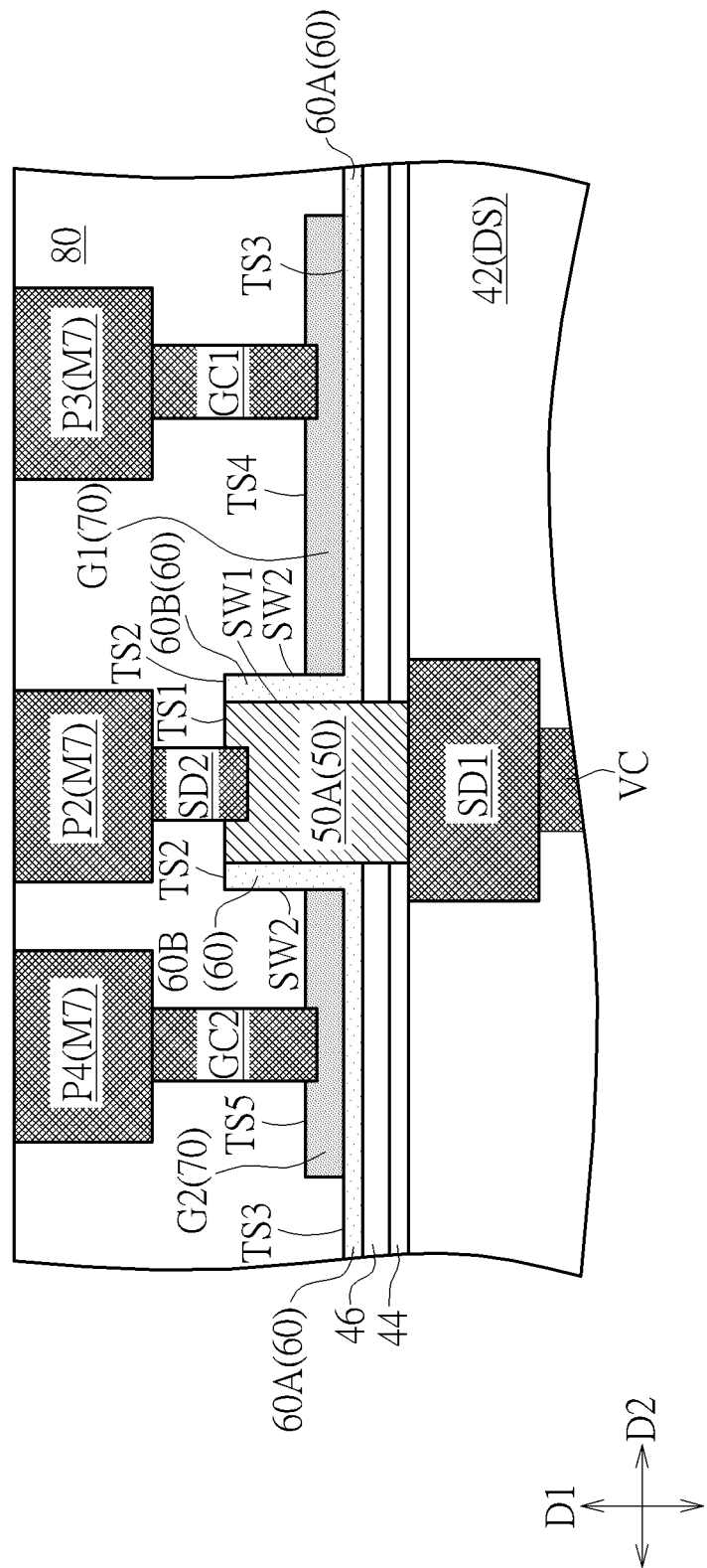
FIG. 2 is a schematic drawing illustrating an enlargement of a part of the semiconductor device according to the first embodiment of the present invention.

Please refer to FIG. 1 and FIG. 2. FIG. 1 is a schematic drawing illustrating a semiconductor device according to a first embodiment of the present invention, and FIG. 2 is a schematic drawing illustrating an enlargement of a part of the semiconductor device in this embodiment. As shown in FIG. 1 and FIG. 2, a semiconductor device 101 is provided in this embodiment, and the semiconductor device 101 includes a dielectric structure DS, a first source/drain electrode SD1, a second source/drain electrode SD2, an oxide semiconductor layer 50A, a gate dielectric layer 60, and a first gate electrode G1. The first source/drain electrode SD1 is disposed in the dielectric structure DS. The oxide semiconductor layer 50A is disposed on the first source/drain electrode SD1 in a vertical direction (such as a first direction D1 shown in FIG. 1). The second source/drain electrode SD2 is disposed on the oxide semiconductor layer 50A in the first direction D1. The gate dielectric layer 60 is disposed on the dielectric structure DS and surrounds the oxide semiconductor layer 50A in a horizontal direction (such as a second direction D2 shown in FIG. 1, but not limited thereto). The gate dielectric layer 60 includes a first portion 60A and a second portion 60B. The first portion 60A is elongated in the horizontal direction (such as the second direction D2). The second portion 60B is disposed on the first portion 60A and elongated in the first direction D1. The first gate electrode G1 is disposed on the first portion 60A of the gate dielectric layer 60. In some embodiments, because the first source/drain electrode SD1 and the second source/drain electrode SD2 are disposed at two opposite sides of the oxide semiconductor layer 50A in the vertical direction respectively and the first gate electrode G1 and the gate dielectric layer 60 are disposed at at least one side of the oxide semiconductor layer 50A in the horizontal direction, a transistor formed with the oxide semiconductor layer 50A, the first source/drain electrode SD1, the second source/drain electrode SD2, the gate dielectric layer 60, and the first gate electrode G1 may be regarded as a vertical transistor for reducing the area occupied by the transistor in the vertical direction and increasing the amount of the transistors and/or the density of the transistors disposed in the semiconductor device, but not limited thereto. Additionally, in some embodiments, the first source/drain electrode SD1 and the second source/drain electrode SD2 may be a source electrode and a drain electrode of the transistor described above respectively. For example, the second source/drain electrode SD2 may be the drain electrode of the transistor when the first source/drain electrode SD1 is used as the source electrode in the transistor, and the second source/drain electrode SD2 may be the source electrode of the transistor when the first source/drain electrode SD1 is used as the drain electrode in the transistor.

In some embodiments, the oxide semiconductor layer 50A may directly contact the first source/drain electrode SD1 and the second source/drain electrode SD2, and the gate dielectric layer 60 may directly contact a sidewall SW1 of the oxide semiconductor layer 50A. The first portion 60A and the second portion 60B of the gate dielectric layer 60 may be directly connected with each other and have an L-shaped structure in a cross-sectional view of the semiconductor device 101, but not limited thereto. At least a part of the second portion 60B of the gate dielectric layer 60 may be disposed between the first gate electrode G1 and the oxide semiconductor layer 50A in the horizontal direction (such as the second direction D2), and at least a part of the first portion 60A of the gate dielectric layer 60 may be disposed between the first gate electrode G1 and the dielectric structure DS in the first direction D1. In some embodiments, a top surface TS1 of the oxide semiconductor layer 50A and a top surface TS2 of the second portion 60B of the gate dielectric layer 60 may be substantially coplanar, and the top surface TS2 of the second portion 60B of the gate dielectric layer 60 may be higher than a top surface TS3 of the first portion 60A of the gate dielectric layer 60 in the first direction D1. In some embodiments, the first gate electrode G1 may be disposed on the top surface TS3 of the first portion 60A of the gate dielectric layer 60, and a top surface TS4 of the first gate electrode G1 may be lower than the top surface TS2 of the second portion 60B of the gate dielectric layer 60 in the first direction D1. In some embodiments, the first gate electrode G1 may directly contact the gate dielectric layer 60. For example, the first gate electrode G1 may directly contact the top surface TS3 of the first portion 60A of the gate dielectric layer 60 and a sidewall SW2 of the second portion 60B of the gate dielectric layer 60, and the top surface TS3 of the first portion 60A may be directly connected with the sidewall SW2 of the second portion 60B.

In some embodiments, the semiconductor device 101 may further include a dielectric layer 44 disposed on the dielectric structure DS and the first source/drain electrode SD1. The dielectric layer 44 may be disposed between the dielectric structure DS and the gate dielectric layer 60 in the first direction D1, and the oxide semiconductor layer 50A may penetrate through the dielectric layer 44 in the first direction D1. In some embodiments, the semiconductor device 101 may further include a dielectric layer 46, and the dielectric layer 44 may be disposed between the dielectric layer 46 and the dielectric structure DS. The material composition of the dielectric layer 46 may be different from the material composition of the dielectric layer 44, and the oxide semiconductor layer 50A may penetrate through the dielectric layer 46 and the dielectric layer 44 in the first direction D1. Additionally, in some embodiments, the semiconductor device 101 may further include a second gate electrode G2 disposed on the first portion 60A of the gate dielectric layer 60. The first gate electrode G1 and the second gate electrode G2 may be disposed at two opposite sides of the oxide semiconductor layer 50A in the second direction D2 respectively, and the second gate electrode G2 is separated from the first gate electrode G1. In other words, the oxide semiconductor layer 50A, the first source/drain electrode SD1, the second source/drain electrode SD2, the gate dielectric layer 60, the first gate electrode G1, and the second gate electrode G2 may form a vertical dual gate transistor.

In some embodiments, a portion of the second portion 60B of the gate dielectric layer 60 (such as the second portion 60B located at the right side of the oxide semiconductor layer 50A shown in FIG. 2) may be disposed between the first gate electrode G1 and the oxide semiconductor layer 50A in the second direction D2, and another part of the second portion 60B of the gate dielectric layer 60 (such as the second portion 60B located at the left side of the oxide semiconductor layer 50A shown in FIG. 2) may be disposed between the second gate electrode G2 and the oxide semiconductor layer 50A in the second direction D2. In addition, a part of the first portion 60A of the gate dielectric layer 60 (such as the first portion 60A located at the right side of the oxide semiconductor layer 50A shown in FIG. 2) may be disposed between the first gate electrode G1 and the dielectric structure DS in the first direction D1, and another part of the first portion 60A of the gate dielectric layer 60 (such as the first portion 60A located at the left side of the oxide semiconductor layer 50A shown in FIG. 2) may be disposed between the second gate electrode G2 and the dielectric structure DS in the first direction D1. In some embodiments, a top surface TS5 of the second gate electrode G2 and the top surface TS4 of first gate electrode G1 may be substantially coplanar, and the top surface TS5 of the second gate electrode G2 may be lower than the top surface TS2 of the second portion 60B of the gate dielectric layer 60 in the first direction D1. In some embodiments, the second gate electrode G2 may directly contact the gate dielectric layer 60. For example, the second gate electrode G2 may directly contact the top surface TS3 of the first portion 60A of the gate dielectric layer 60 and the sidewall SW2 of the second portion 60B of the gate dielectric layer 60. It is worth noting that, in some embodiments, the top surface TS1, the top surface TS2, the top surface TS3, the top surface TS4, and the top surface TS5 may be the topmost surfaces of the corresponding parts in the first direction D1 respectively.

In some embodiments, the semiconductor device 101 may further include a semiconductor substrate 10 and an interconnection structure CS. The dielectric structure DS may be disposed on the semiconductor substrate 10, and at least a part of the interconnection structure CS may be disposed in the dielectric structure DS. Active units, passive units, and/or related circuits may be disposed on the semiconductor substrate 10 according to some design considerations, and the interconnection structure CS may be electrically connected with the units and/or the circuits on the semiconductor substrate 10, but not limited thereto. For example, a doped region 12 may be disposed in the semiconductor substrate 10, the interconnection structure CS may be electrically connected with the doped region 12 via a contact structure 20 penetrating through material layers (such as a dielectric layer 14 and an interlayer dielectric layer 16) between the dielectric structure DS and the semiconductor substrate 10, and the doped region 12 may be a portion of a transistor or a portion of other types of semiconductor units. Additionally, in some embodiments, the dielectric structure DS may include a plurality of dielectric layers (such as a dielectric layer 18, a dielectric layer 22, a dielectric layer 24, a dielectric layer 26, a dielectric layer 28, a dielectric layer 30, a dielectric layer 32, a dielectric layer 34, a dielectric layer 36, a dielectric layer 38, a dielectric layer 40, and a dielectric layer 42 shown in FIG. 1) stacked in the first direction D1, and the interconnection structure CS may include a plurality of conductive layers (such as a conductive layer M1, a conductive layer M2, a conductive layer M3, a conductive layer M4, a conductive layer M5, a conductive layer M6, and a conductive layer M7 shown in FIG. 1) and a plurality of connection plugs (such as a connection plug V1, a connection plug V2, a connection plug V3, a connection plug V4, a connection plug V5, and a connection plug V6 shown in FIG. 1) alternately disposed in the first direction D1.

In some embodiments, the first direction D1 described above may be regarded as a thickness direction of the semiconductor substrate 10. The semiconductor substrate 10 has a top surface S1 and a bottom surface S2 opposite to the top surface S1 in the first direction D1, and the horizontal direction (such as the second direction D2) substantially orthogonal to the first direction D1 may be parallel with the top surface S1 and/or the bottom surface S2 of the semiconductor substrate 10, but not limited thereto. Additionally, in this description, a distance between the bottom surface S2 of the semiconductor substrate 10 and a relatively higher location and/or a relatively higher part in the first direction D1 is greater than a distance between the bottom surface S2 of the semiconductor substrate 10 and a relatively lower location and/or a relatively lower part in the first direction D1. The bottom of each part may be closer to the bottom surface S2 of the semiconductor substrate 10 in the first direction D1 than the top of this part. Another part disposed above a specific part may be regarded as being relatively far from the bottom surface S2 of the semiconductor substrate 10 in the first direction D1, and another part disposed under a specific part may be regarded as being relatively closer to the bottom surface S2 of the semiconductor substrate 10 in the first direction D1.

In some embodiments, the first source/drain electrode SD1 may be electrically connected with the interconnection structure CS, and the first source/drain electrode SD1 may be electrically connected with the units on the semiconductor substrate 10 via the interconnection structure CS and/or be electrically connected with other parts located above the dielectric structure DS via the interconnection structure CS. In some embodiments, the semiconductor device 101 may further include a connection plug VC disposed under the first source/drain electrode SD1, and the first source/drain electrode SD1 may be electrically connected with the conductive layer in the interconnection structure CS (such as the conductive layer M5, but not limited thereto) via the connection plug VC. Additionally, in some embodiments, the semiconductor device 101 may further include an interlayer dielectric layer 80, a first gate contact structure GC1, and a second gate contact structure GC2. The first gate contact structure GC1 and the second gate contact structure GC2 may be disposed on and electrically connected with the first gate electrode G1 and the second gate electrode G2 respectively. The interlayer dielectric layer 80 may cover the dielectric layer 46, the gate dielectric layer 60, the first gate electrode G1, the second gate electrode G2, and the oxide semiconductor layer 50A. The second source/drain electrode SD2, the first gate contact structure GC1, the second gate contact structure GC2, and the conductive layer M7 and the connection plug V6 in the interconnection structure CS may be at least partially disposed in the interlayer dielectric layer 80 respectively, but not limited thereto.

In some embodiments, the conductive layer M7 may include a first portion P1, a second portion P2, a third portion P3, and a fourth portion P4. The first portion P1 may be connected with the connection plug V6, the second portion P2 may be disposed on and electrically connected with the second source/drain electrode SD2, the third portion P3 may be disposed on the first gate contact structure GC1 and electrically connected with the first gate electrode G1 via the first gate contact structure GC1, and the fourth portion P4 may be disposed on the second gate contact structure GC2 and electrically connected with the second gate electrode G2 via the second gate contact structure GC2. The first portion P1, the second portion P2, the third portion P3, and the fourth portion P4 of the conductive layer M7 may be electrically isolated from one another according to some design considerations, or at least two of the first portion P1, the second portion P2, the third portion P3, and the fourth portion P4 may be electrically isolated from each other according to some design considerations.

In some embodiments, a top surface of the first source/drain electrode SD1 and a top surface of the conductive layer M6 in the interconnection structure CS may be substantially coplanar, and the connection plug V6 located between the conductive layer M6 and the conductive layer M7 may penetrate through the gate dielectric layer 60, the dielectric layer 46, and the dielectric layer 44 in the first direction D1. In other words, the interconnection structure CS may penetrate through the first portion 60A of the gate dielectric layer 60 in the first direction D1.

The semiconductor substrate 10 may include a silicon substrate, a silicon germanium semiconductor substrate, a silicon-on-insulator (SOI) substrate, or a substrate formed of other suitable semiconductor materials. The first gate electrode G1 and the second gate electrode G2 may respectively include a metallic conductive material, such as tungsten, aluminum, copper, titanium aluminide (TiAl), titanium, titanium nitride (TiN), tantalum, tantalum nitride (TaN), and titanium aluminum oxide (TiAlO), or other suitable conductive materials. The gate dielectric layer 60 may include silicon oxide, silicon oxynitride, a high dielectric constant (high-k) material, or other suitable dielectric materials. The high-k material described above may include materials such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials.

The oxide semiconductor layer 50A may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned elements, but not limited thereto. Additionally, the oxide semiconductor layer 50A may be a single layer structure or a multiple layer structure composed of the above-mentioned oxide semiconductor materials and the crystalline conditions of the above-mentioned oxide semiconductor materials are also not limited. For example, the above-mentioned oxide semiconductor materials may be amorphous IGZO (a-IGZO), crystal IGZO (c-IGZO), or C-axis aligned crystal IGZO (CAAC-IGZO).

The dielectric layer 14, the interlayer dielectric layer 16, the dielectric layer 18, the dielectric layer 22, the dielectric layer 24, the dielectric layer 26, the dielectric layer 28, the dielectric layer 30, the dielectric layer 32, the dielectric layer 34, the dielectric layer 36, the dielectric layer 38, the dielectric layer 40, the dielectric layer 42, the dielectric layer 44, the dielectric layer 46, and the interlayer dielectric layer 80 described above may respectively include silicon oxide, silicon nitride, silicon carbonitride, fluorosilicate glass (FSG), or other suitable dielectric materials. Additionally, in some embodiments, the interlayer dielectric layer 16, the dielectric layer 22, the dielectric layer 26, the dielectric layer 30, the dielectric layer 34, the dielectric layer 38, the dielectric layer 42, the dielectric layer 46, and the interlayer dielectric layer 80 may respectively include a low dielectric constant (low-k) material, such as benzocyciclobutene (BCB), hydrogen silsesquioxane (HSQ), methyl silesquioxane (MSQ), hydrogenated silicon oxycarbide (SiOC—H), a porous dielectric material, or other suitable low-k dielectric materials. The contact structure 20, the conductive layers and the connection plugs in the interconnection structure CS, the connection plug VC, the first source/drain electrode SD1, the second source/drain electrode SD2, the first gate contact structure GC1, and the second gate contact structure GC2 may respectively include a low resistance material and a barrier layer, but not limited thereto. The low resistance material described above may include materials with relatively lower resistivity, such as copper, aluminum, and tungsten, and the barrier layer described above may include titanium nitride, tantalum nitride, or other suitable conductive barrier materials, but not limited thereto.

Please refer to FIGS. 1-13. FIGS. 3-13 are schematic drawings illustrating a manufacturing method of the semiconductor device according to the first embodiment of the present invention, and FIG. 1 may be regarded as a schematic drawing in a step subsequent to FIG. 13. As shown in FIG. 1 and FIG. 2, the manufacturing method of the semiconductor device 101 may include the following steps. The first source/drain electrode SD1 is formed in the dielectric structure DS. The oxide semiconductor layer 50A is formed on the first source/drain electrode SD1 in the vertical direction (such as the first direction D1). The gate dielectric layer 60 is formed on the dielectric structure DS. The gate dielectric layer 60 may surround the oxide semiconductor layer 50A in the horizontal direction (such as the second direction D2), and the gate dielectric layer 60 includes the first portion 60A and the second portion 60B. The first portion 60A is elongated in the second direction D2. The second portion 60B is disposed on the first portion 60A and elongated in the first direction D1. Subsequently, the first gate electrode G1 is formed on the first portion 60A of the gate dielectric layer 60, and the second source/drain electrode SD2 is formed on the oxide semiconductor layer 50A in the first direction D1.

Figure 3:
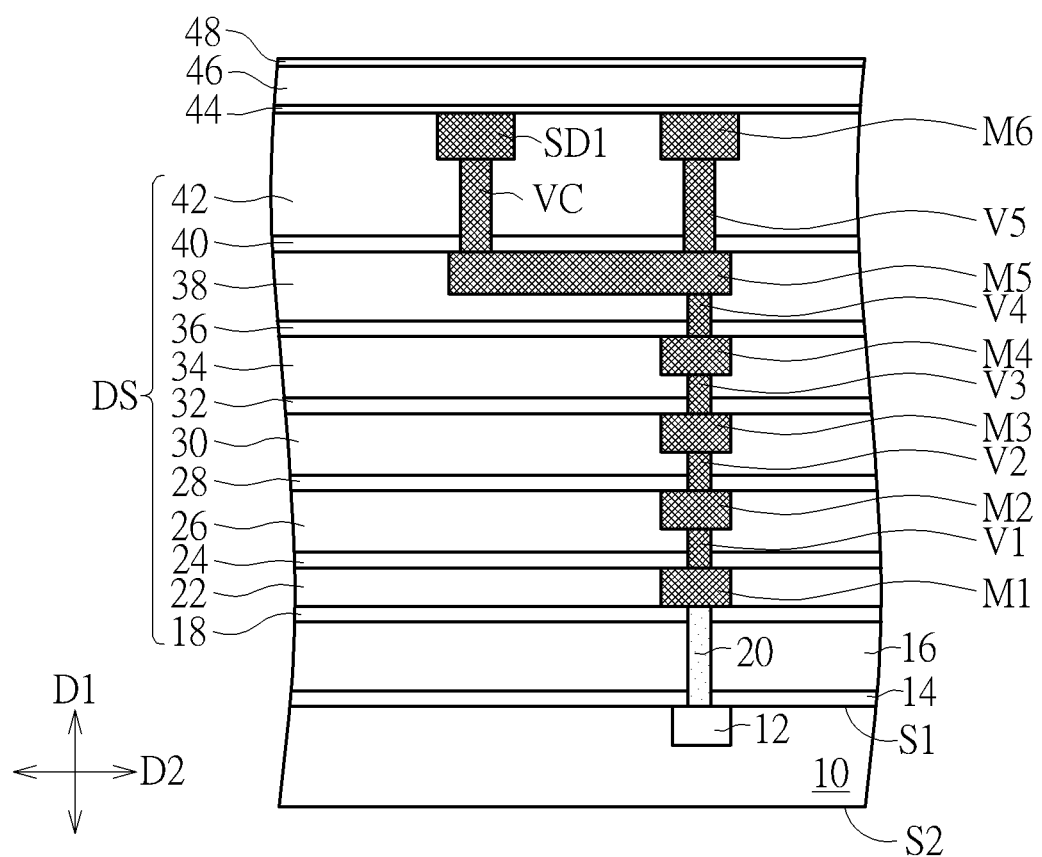

Specifically, in some embodiments, the manufacturing method of the semiconductor device 101 may include but is not limited to the following steps. Firstly, as shown in FIG. 3, the dielectric layer 14, the interlayer dielectric layer 16, the dielectric structure DS, the contact structure 20, the conductive layers M1-M6, the connection plugs V1-V5, the connection plug VC, and the first source/drain electrode SD1 may be formed on the semiconductor substrate 10. In some embodiments, the connection plug VC and the connection plug V5 may be formed concurrently by the same material and/or the same manufacturing process, and the first source/drain electrode SD1 and the conductive layer M6 may be formed concurrently by the same material and/or the same manufacturing process for simplifying the manufacturing processes. After the step of forming the first source/drain electrode SD1 and the conductive layer M6, the dielectric layer 44 may be formed on the dielectric structure DS and the first source/drain electrode SD1, the dielectric layer 46 may be formed on the dielectric layer 44, and a dielectric layer 48 may be formed on the dielectric layer 46. In some embodiments, the material of the dielectric layer 48 may be similar to the material of the dielectric layer 44, and the material and/or the thickness of the dielectric layer 46 may be different from the material and/or the thickness of the dielectric layer 44 and the dielectric layer 48 according to some design considerations for other manufacturing processes subsequently performed, but not limited thereto. For example, the material of the dielectric layer 44 and the material of the dielectric layer 48 may include silicon nitride, and the material of the dielectric layer 46 may include a low-k dielectric material for providing required etching selectivity in subsequent etching processes. The thickness of the dielectric layer 46 may be greater than the thickness of the dielectric layer 44 and the thickness of the dielectric layer 48 for controlling the sidewall of the oxide semiconductor layer (not shown in FIG. 3) exposed by etching the dielectric layer 48 and the dielectric layer 46.

Figure 4:
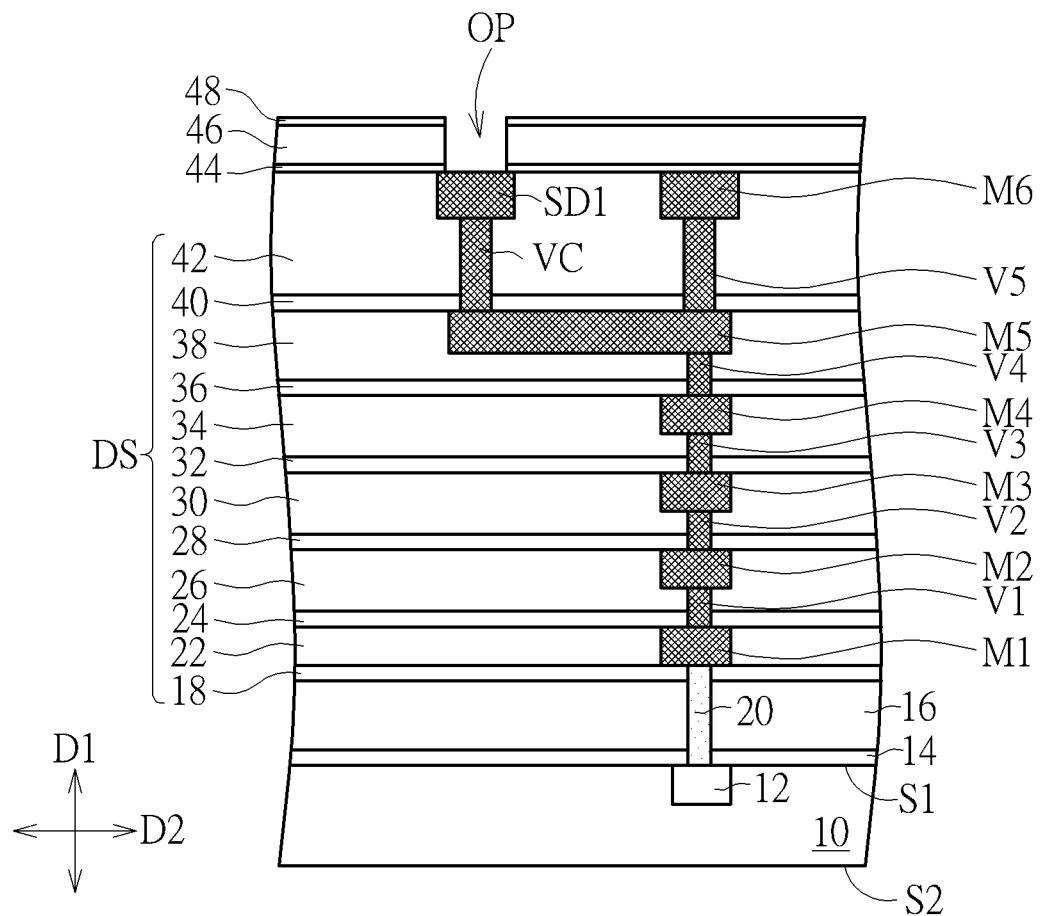
Figure 5:
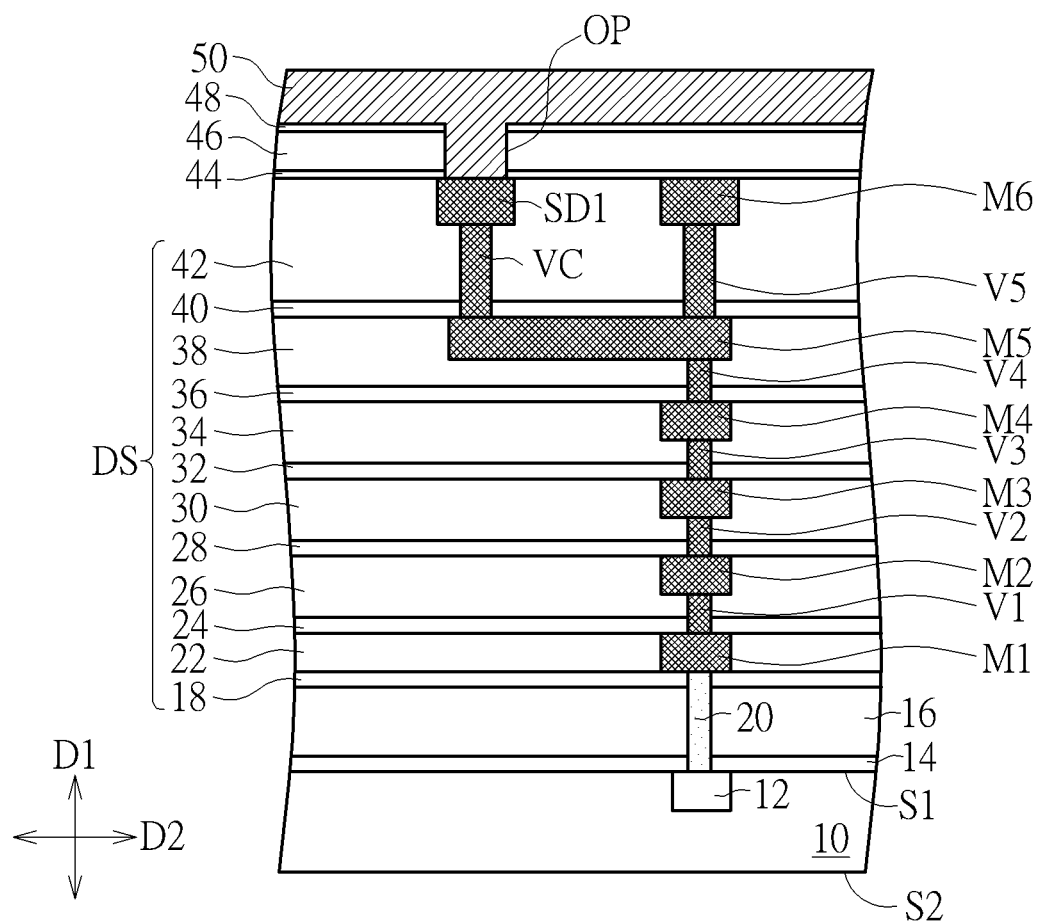
Figure 6:
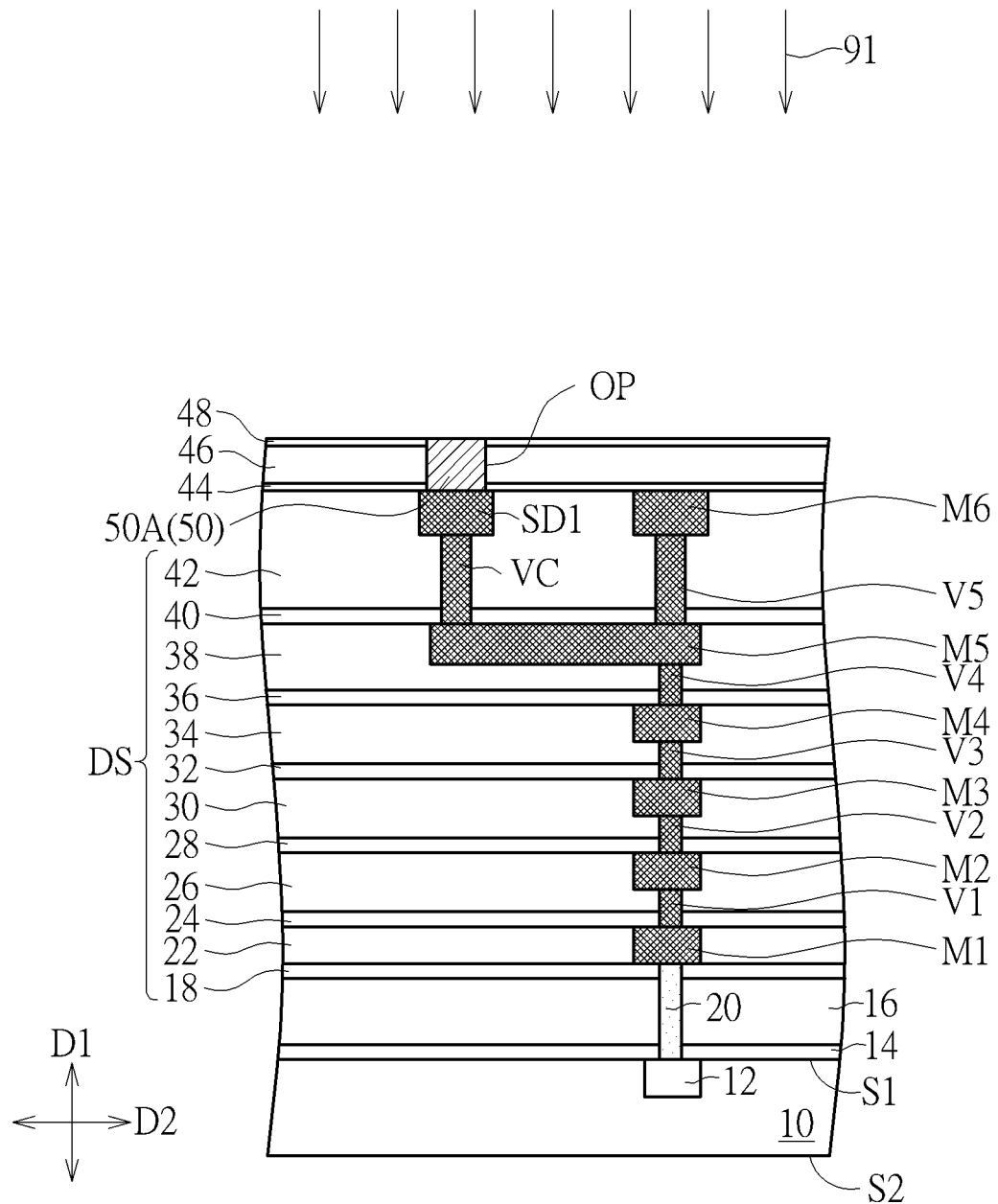

Subsequently, as shown in FIG. 3 and FIG. 4, an opening OP is formed. The opening OP may penetrate through the dielectric layer 48, the dielectric layer 46, and the dielectric layer 44 in the first direction D1 and expose a part of the first source/drain electrode SD1. As shown in FIG. 4 and FIG. 5, an oxide semiconductor material 50 may then be formed. The oxide semiconductor material 50 may be formed on the dielectric layer 48 and formed in the opening OP. In some embodiments, the oxide semiconductor material 50 may be a single layer structure or a multiple layer structure, and the opening OP may be fully filled with the oxide semiconductor material 50, but not limited thereto. As shown in FIG. 5 and FIG. 6, a planarization process 91 may be subsequently performed for removing the oxide semiconductor material 50 outside the opening OP and forming the oxide semiconductor layer 50A in the opening OP. The planarization process 91 may include a chemical mechanical polishing (CMP) process, an etching back process, or other suitable planarization approaches. It is worth noting that the method of forming the oxide semiconductor layer 50A in this embodiment is not limited to the steps described above and other suitable approaches (such as performing a patterning process to the oxide semiconductor material 50 for forming the oxide semiconductor layer 50A without forming the opening OP) may be used to form the oxide semiconductor layer 50A according to other design considerations.

Figure 7:
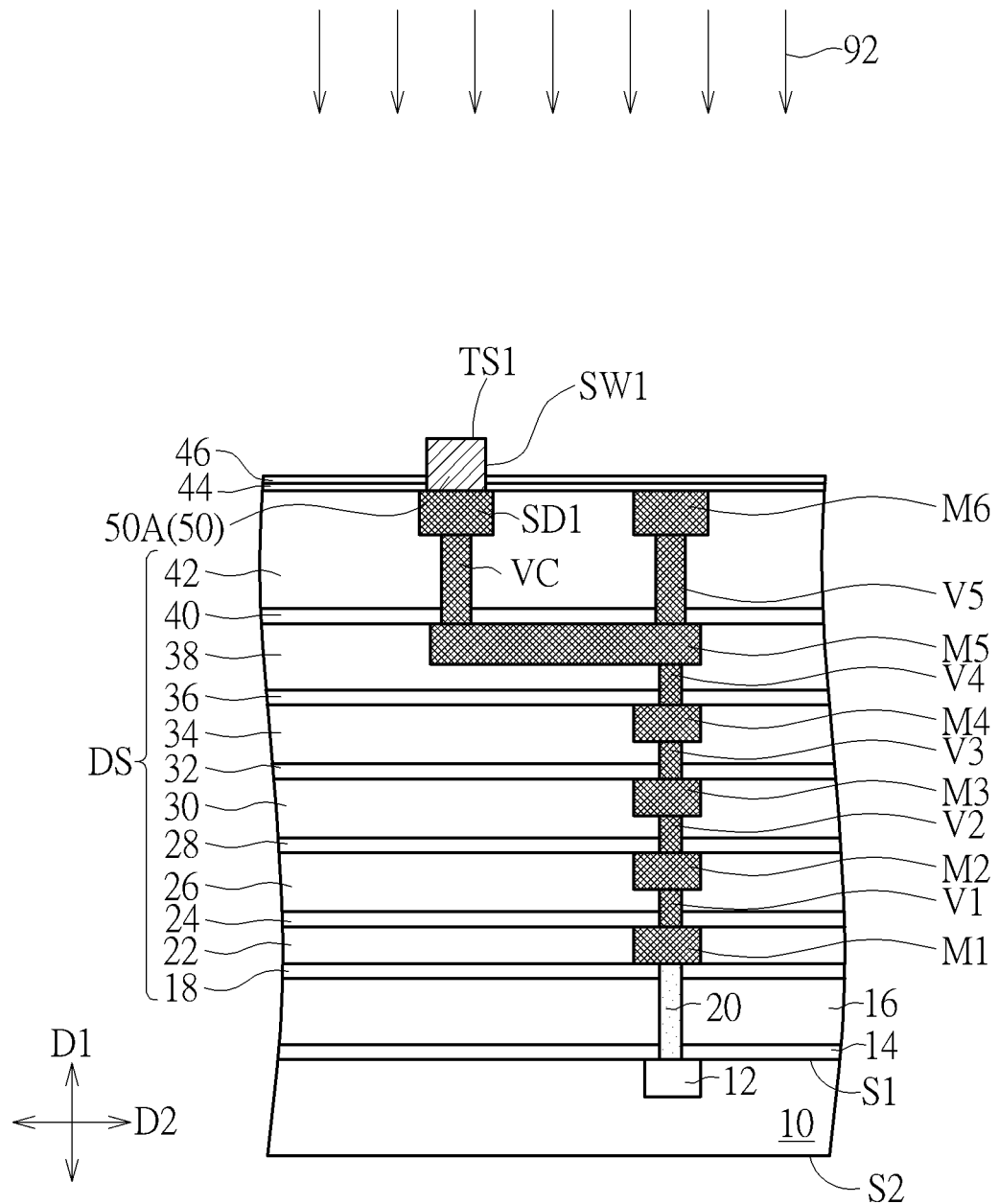
Figure 8:
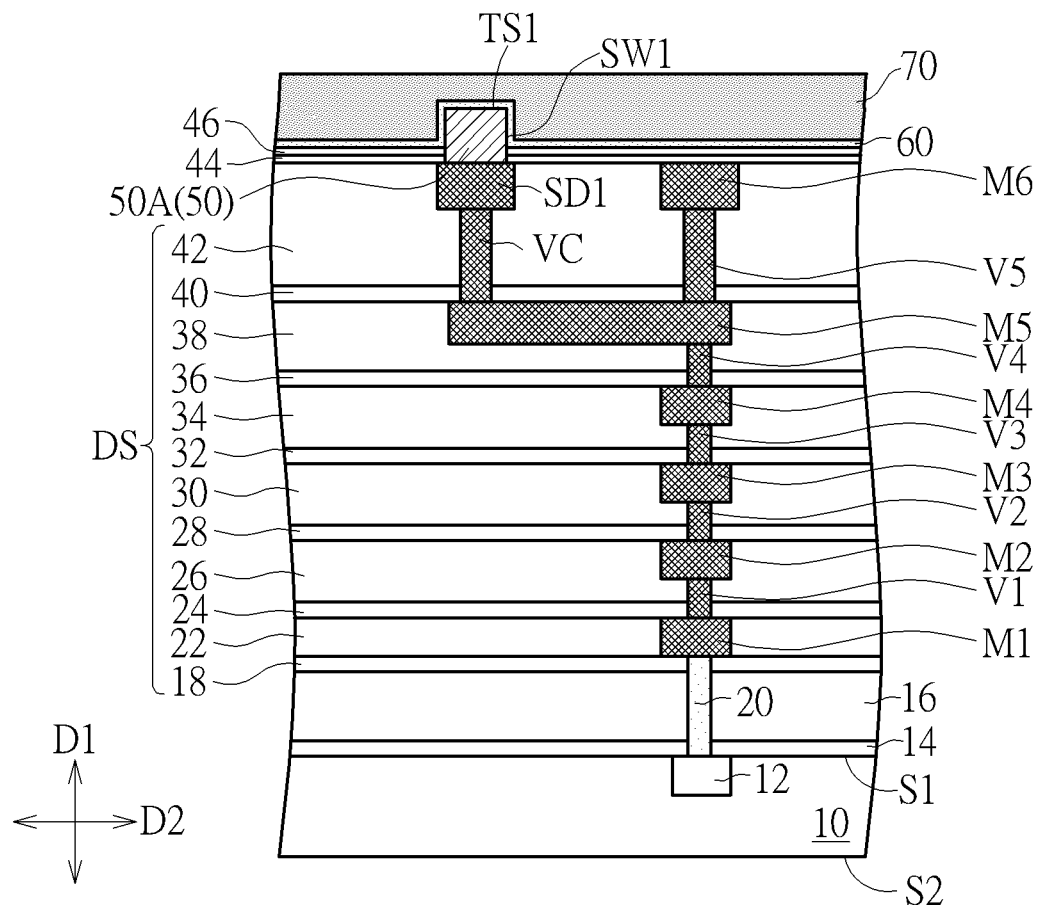

Subsequently, as shown in FIG. 6 and FIG. 7, the dielectric layer 48 and the dielectric layer 46 may be etched by an etching process 92, and the etching process 92 may be used to remove the dielectric layer 48 and at least a part of the dielectric layer 46 for exposing at least a part of the sidewall SW1 of the oxide semiconductor layer 50A. It is worth noting that the etching condition and/or the recessing condition of the dielectric layer 46 may be controlled by the etching process 92, and the exposed area of the sidewall SW1 may be controlled accordingly. In some embodiments, the dielectric layer 46 may be removed completely according to some design considerations, the dielectric layer 44 may be used as an etching stop layer in the etching process 92, and the material composition of the dielectric layer 44 may be different from the material composition of the dielectric layer 46 and the material composition of the dielectric layer 48 preferably in this situation. As shown in FIG. 7 and FIG. 8, the gate dielectric layer 60 may then be formed conformally on the oxide semiconductor layer 50A and the dielectric layer 46, and a gate material layer 70 may be formed on the gate dielectric layer 60. The gate material layer 70 may include a metallic conductive material, such as tungsten, aluminum, copper, titanium aluminide, titanium, titanium nitride, tantalum, tantalum nitride, and titanium aluminum oxide, or other suitable conductive materials. In some embodiments, at least a part of the dielectric layer 46 may be removed before the step of forming the gate dielectric layer 60 for exposing at least a part of the sidewall SW1 of the oxide semiconductor layer 50A, and the second portion of the gate dielectric layer 60 (such as the second portion 60B shown in FIG. 2) may be formed on the sidewall SW1 of the oxide semiconductor layer 50A.

Figure 9:
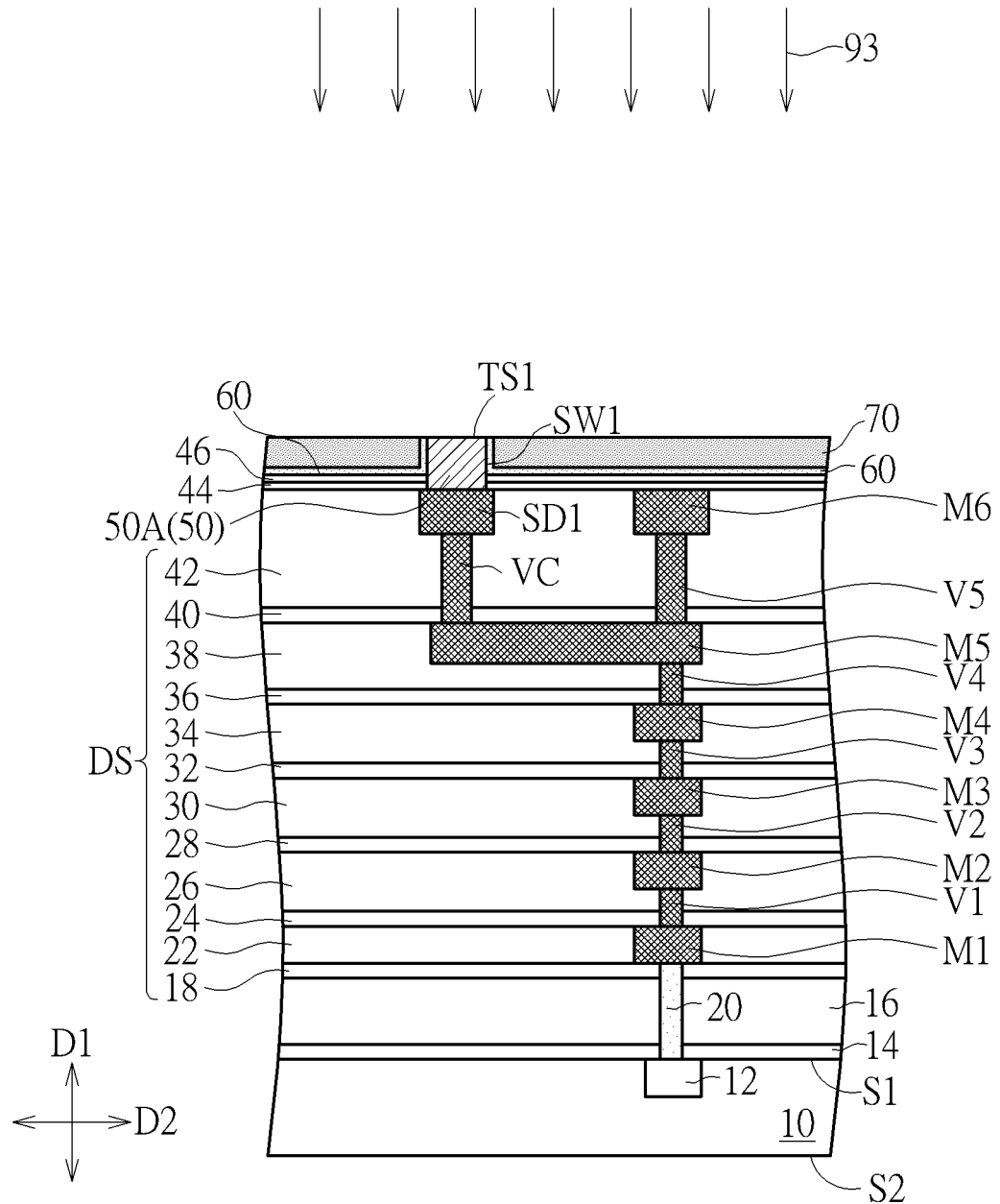
Figure 10:
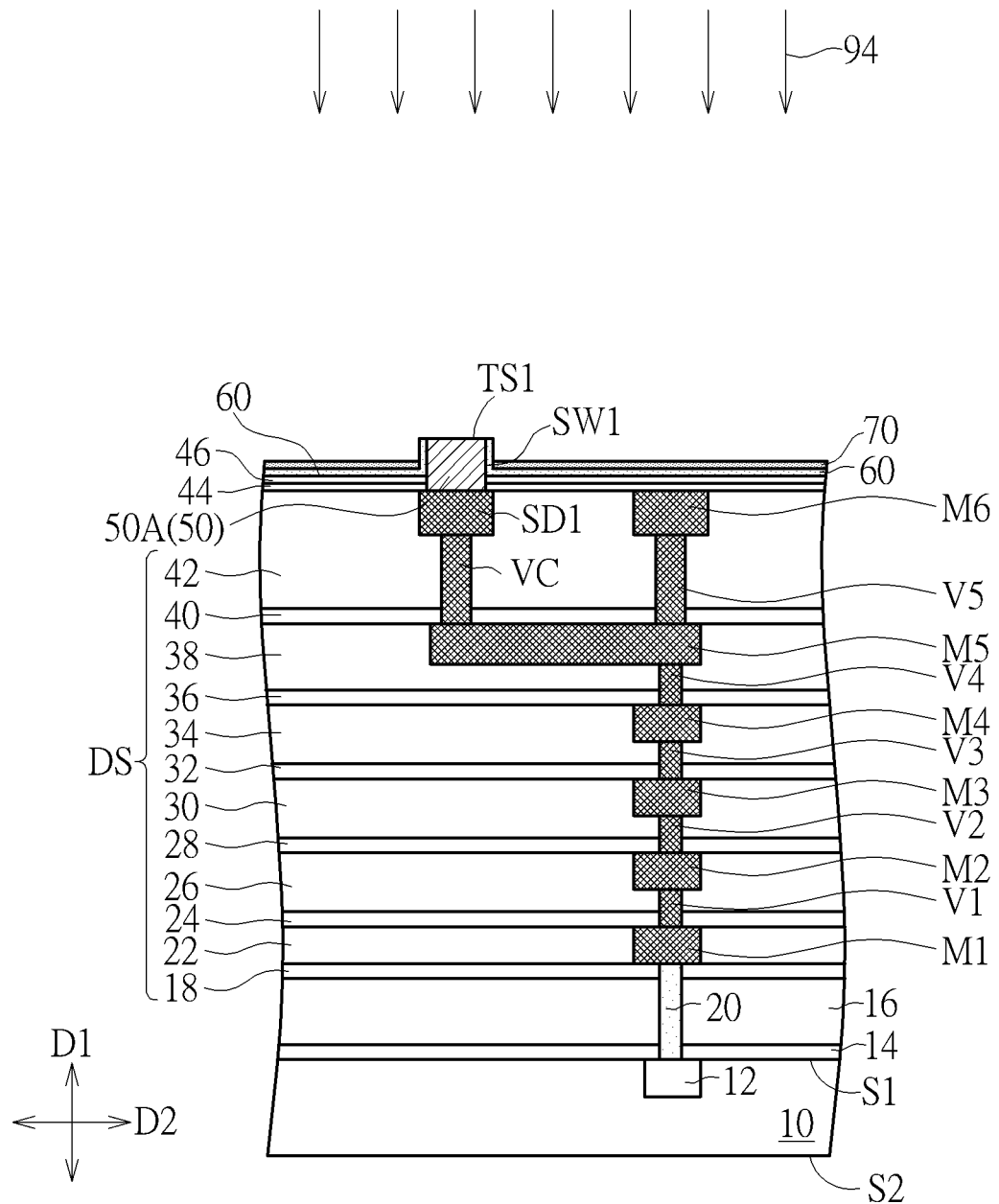
Figure 11:
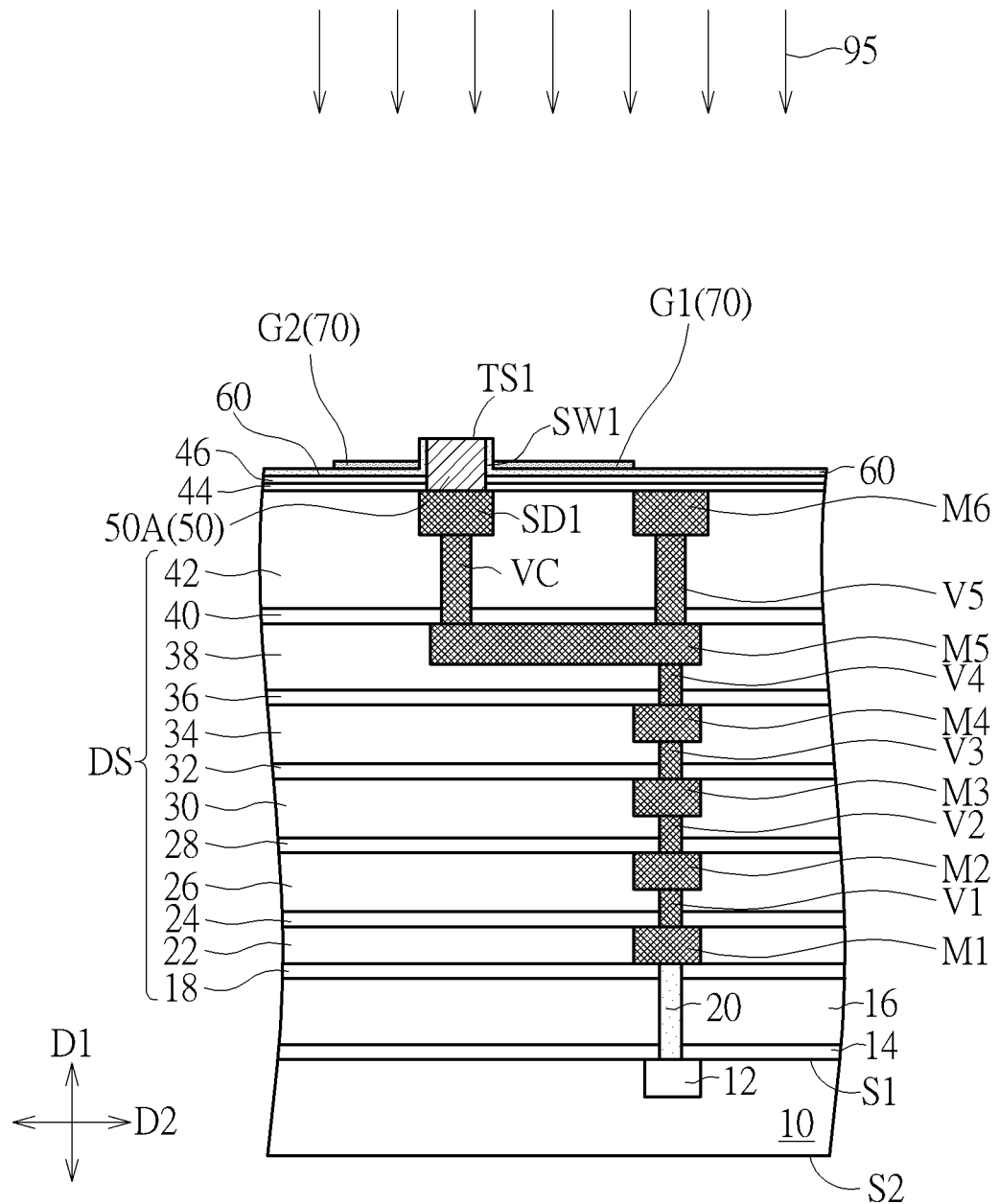
Figure 12:
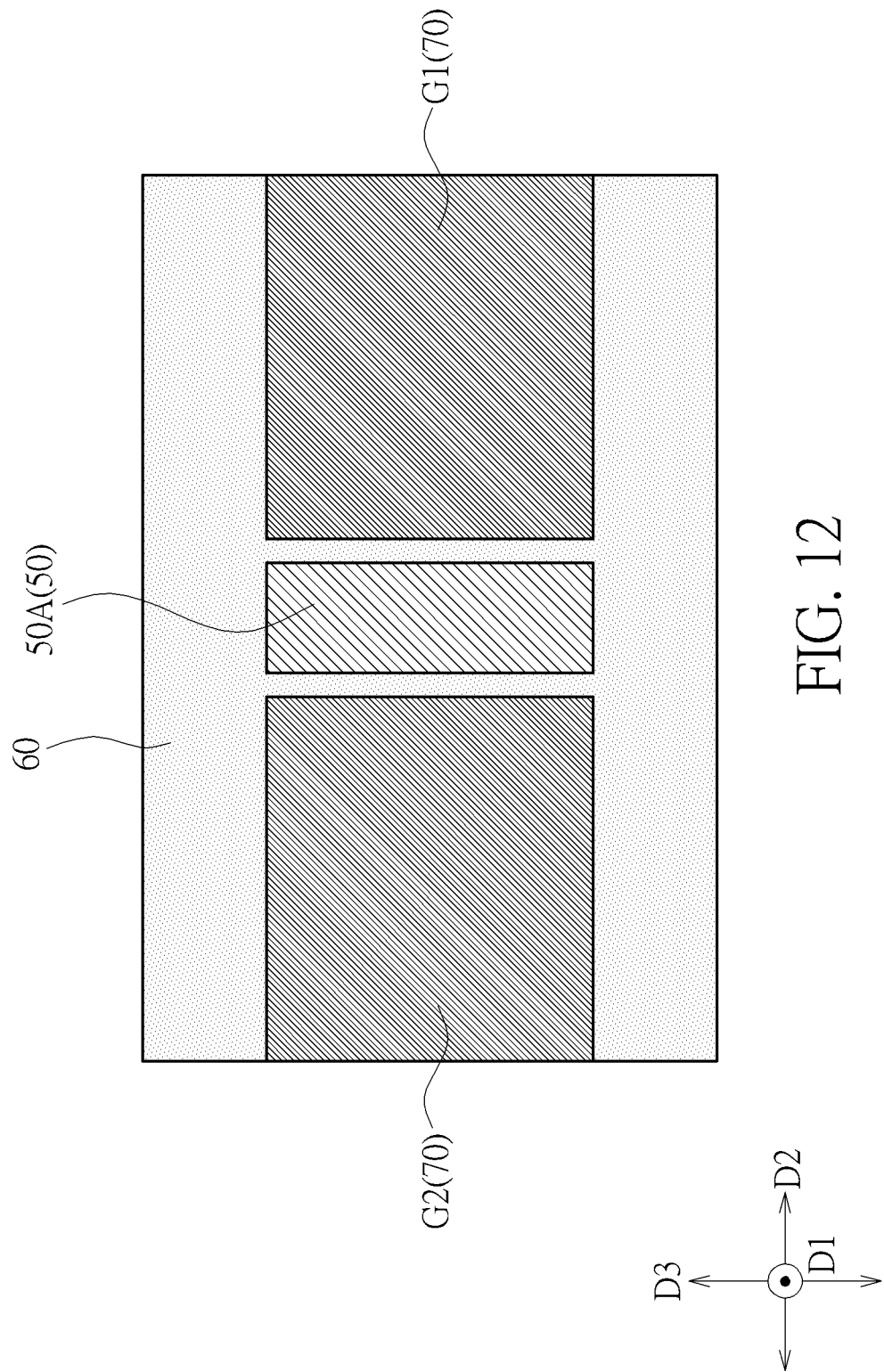

As shown in FIG. 8 and FIG. 9, a part of the gate material layer 70 and a part of the gate dielectric layer 60 may be then removed by a planarization process 93 for exposing the top surface TS1 of the oxide semiconductor layer 50A. The planarization process 93 may include a CMP process, an etching back process, or other suitable planarization approaches. Subsequently, as shown in FIG. 9 and FIG. 10, an etching process 94 may be used to perform a recessing treatment to the gate material layer 70 for avoiding the gate material layer 70 from directly contacting the oxide semiconductor layer 50A after the planarization process 93, but not limited thereto. As shown in FIG. 10 and FIG. 11, a patterning process 95 may then be performed for patterning the gate material layer 70 so as to form the first gate electrode G1. The patterning process 95 may include a photolithography process or other suitable patterning approaches. In some embodiments, the second gate electrode G2 described above may be formed on the first portion of the gate dielectric layer 60 (such as the first portion 60A shown in FIG. 2) by patterning the gate material layer 70 via the patterning process 95. The first gate electrode G1 and the second gate electrode G2 may be formed concurrently by performing the patterning process 95 to the gate material layer 70 formed on the gate dielectric layer 60, and the material composition of the second gate electrode G2 may be identical to the material composition of the first gate electrode G1 accordingly, but not limited thereto. In some embodiments, the first gate electrode G1 and the second gate electrode G2 may be respectively formed by using different materials and/or different manufacturing processes according to some design considerations. As shown in FIG. 11 and FIG. 12, in some embodiments, the gate dielectric layer 60 may surround the oxide semiconductor layer 50A in the horizontal direction (such as the second direction D2 and the third direction D3 shown in FIG. 12 and/or other directions orthogonal to the first direction D1), and the first gate electrode G1 and the second gate electrode G2 may be located at two opposite sides of the oxide semiconductor layer 50A in the second direction D2 respectively and separated from each other.

Figure 13:
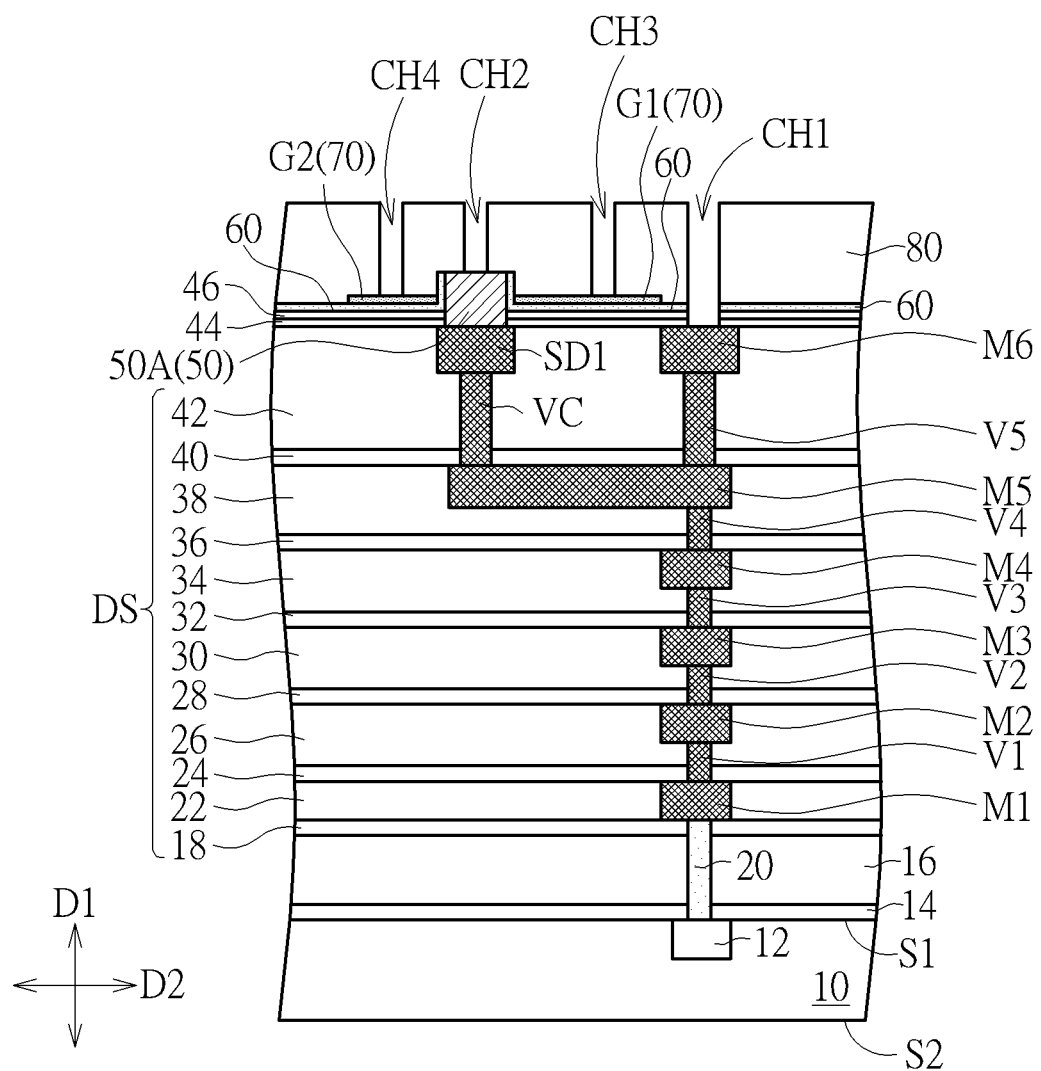

As shown in FIG. 11 and FIG. 13, the interlayer dielectric layer 80 may be formed covering the dielectric layer 46, the gate dielectric layer 60, the first gate electrode G1, the second gate electrode G2, and the oxide semiconductor layer 50A, and a contact hole CH1, a contact hole CH2, a contact hole CH3, and a contact hole CH4 may be formed. The first contact hole CH1 may penetrate through the interlayer dielectric layer 80, the gate dielectric layer 60, the dielectric layer 46, and the dielectric layer 44 on the conductive layer M6 in the first direction D1 for exposing at least a part of the conductive layer M6. The contact hole CH2 may penetrate through the interlayer dielectric layer 80 on the oxide semiconductor layer 50A in the first direction D1 for exposing at least a part of the oxide semiconductor layer 50A. The contact hole CH3 may penetrate through the interlayer dielectric layer 80 on the first gate electrode G1 in the first direction D1 for exposing at least a part of the first gate electrode G1. The contact hole CH4 may penetrate through the interlayer dielectric layer 80 on the second gate electrode G2 in the first direction D1 for exposing at least a part of the second gate electrode G1.

Subsequently, as shown in FIG. 13 and FIG. 1, the connection plug V6, the second source/drain electrode SD2, the first gate contact structure GC1, and the second gate contact structure GC2 may be formed in the contact hole CH1, the contact hole CH2, the contact hole CH3, and the contact hole CH4 respectively, and the first portion P1, the second portion p2, the third portion P3, and the fourth portion P4 of the conductive layer M7 may be formed on the connection plug V6, the second source/drain electrode SD2, the first gate contact structure GC1, and the second gate contact structure GC2 respectively. In some embodiments, the connection plug V6, the second source/drain electrode SD2, the first gate contact structure GC1, the second gate contact structure GC2, and the first portion P1, the second portion p2, the third portion P3, and the fourth portion P4 of the conductive layer M7 may be may be formed concurrently by the same manufacturing process for simplifying the related processes and being formed self-aligned.

The amount of the photomasks required in the manufacturing process may be reduced because some of the processes of forming the interconnection structure CS may be used to form the first source/drain electrode SD1 and the second source/drain electrode SD2 in the manufacturing method described above, and the purposes of reducing the manufacturing cost and/or simplifying the related processes may be achieved accordingly. For example, there may be two additional photomasks (such as a photomask used in the process of forming the opening OP shown in FIG. 4 described above and a photomask used in the patterning process 95 shown in FIG. 11 described above) required for forming the dual gate transistor composed of the oxide semiconductor layer 50A, the first source/drain electrode SD1, the second source/drain electrode SD2, the gate dielectric layer 60, the first gate electrode G1, and the second gate electrode G2, and the additional cost for forming the oxide semiconductor transistors in the back end of line (BEOL) process may be relatively reduced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 14:
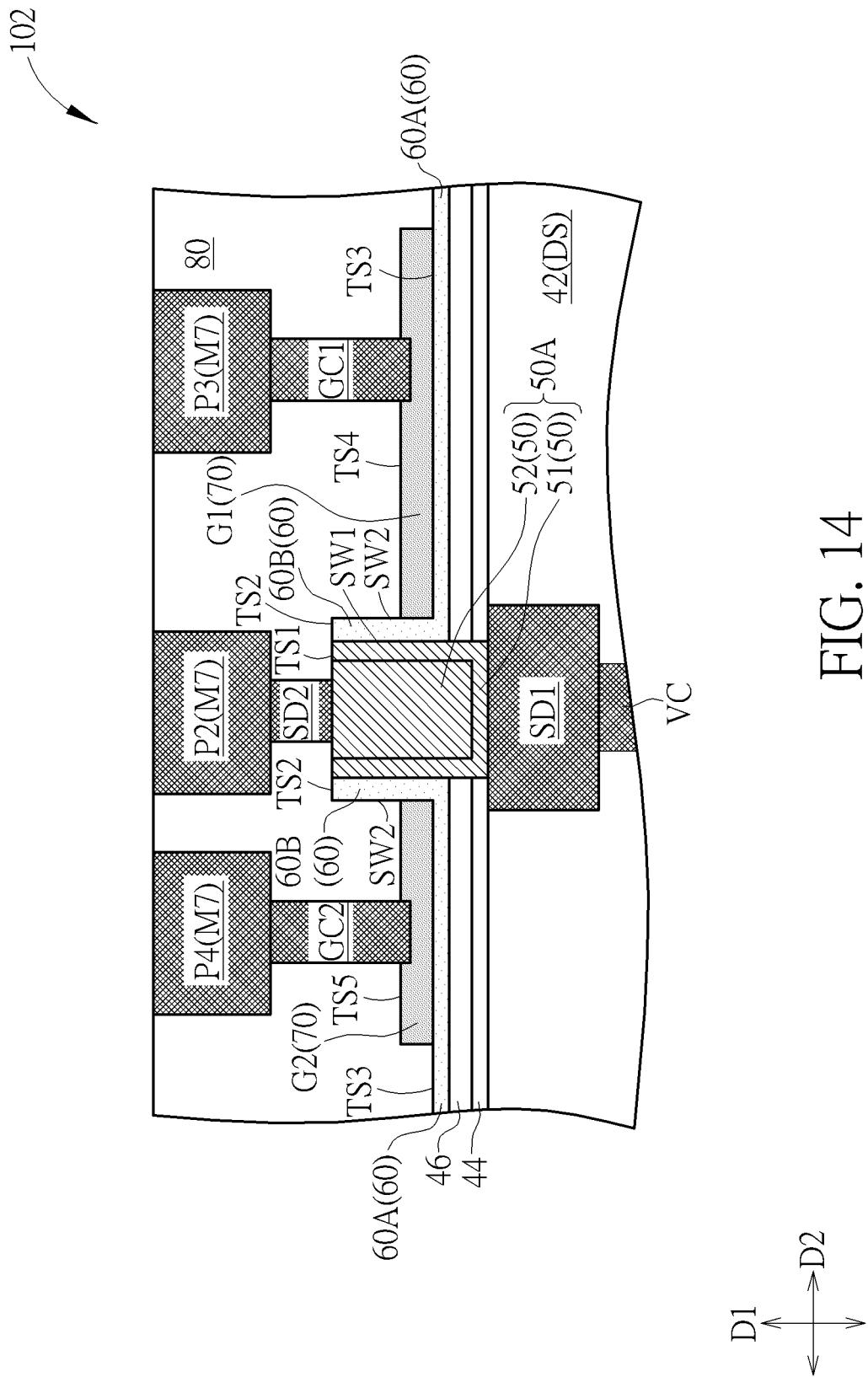
FIG. 14 is a schematic drawing illustrating a semiconductor device according to a second embodiment of the present invention.

Please refer to FIG. 14. FIG. 14 is a schematic drawing illustrating a semiconductor device 102 according to a second embodiment of the present invention. As shown in FIG. 14, in the semiconductor device 102, the oxide semiconductor layer 50A may include a first layer 51 and a second layer 52 disposed on the first layer 51. In other words, the oxide semiconductor material 50 used to form the oxide semiconductor layer 50A may be a multiple layer structure including the first layer 51 and the second layer 52. In some embodiments, a part of the first layer 51 may be disposed between the second layer 52 and the first source/drain electrode SD1 in the first direction D1, and another part of the first layer 51 may be disposed between the second layer 52 and the gate dielectric layer 60 in the second direction D2. In some embodiments, the first layer 51 may include a U-shaped structure surrounding the second layer 52 in a cross-sectional view of the oxide semiconductor layer 50A because the method of forming the oxide semiconductor layer 50A may include the steps shown in FIGS. 4-6 described above and the first layer 51 may be formed conformally in the opening OP shown in FIG. 5 described above before the step of forming the second layer 52, but not limited thereto. Additionally, in some embodiments, a material composition of the first layer 51 may be different from a material composition of the second layer 52. For example, the electron mobility of the first layer 51 may be higher than the electron mobility of the second layer 52 by controlling the differences in material compositions, component ratios, and/or crystalline conditions between the first layer 51 and the second layer 52, and the on-current of the transistor may be enhanced accordingly, but not limited thereto. In some embodiments, the material compositions, the component ratios, the crystalline conditions, and/or other properties of the first layer 51 and the second layer 52 in the oxide semiconductor layer 50A may be further modified according to other design considerations. It is worth noting that the multiple layer structure of the oxide semiconductor layer 50A described in this embodiment may also be applied in other embodiments of the present invention according to some design considerations.

Figure 15:
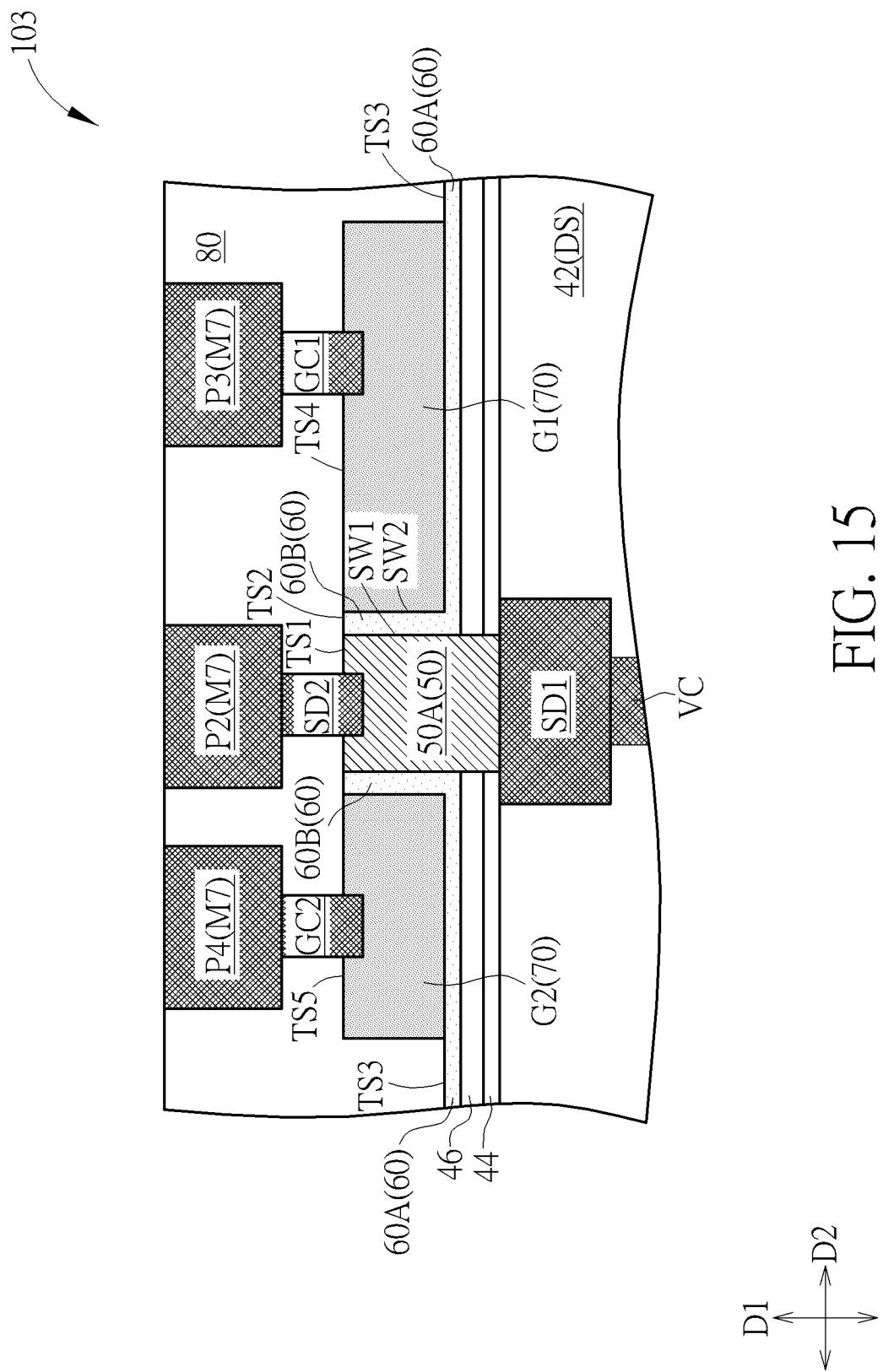
FIG. 15 is a schematic drawing illustrating a semiconductor device according to a third embodiment of the present invention.

Please refer to FIG. 15. FIG. 15 is a schematic drawing illustrating a semiconductor device 103 according to a third embodiment of the present invention. As shown in FIG. 15, in the semiconductor device 103, the top surface TS4 of the first gate electrode G1 and the top surface TS2 of the second portion 60B of the gate dielectric layer 60 may be substantially coplanar for increasing the area where the first gate electrode G1 overlaps the second portion 60B of the gate dielectric layer 60 and the oxide semiconductor layer 50A in the second direction D2, and the related electrical performance of the transistor may be enhanced accordingly, but not limited thereto. In some embodiments, the top surface TS1 of the oxide semiconductor layer 50A, the top surface TS2 of the second portion 60B of the gate dielectric layer 60, the top surface TS4 of the first gate electrode G1, and the top surface TS5 of the second gate electrode G2 may be substantially coplanar. In some embodiments, the manufacturing method of the semiconductor device 103 may be similar to the manufacturing method of the semiconductor device in the first embodiment described above, and the etching process 94 shown in FIG. 10 described above may be omitted in the manufacturing method of the semiconductor device 103.

Figure 16:
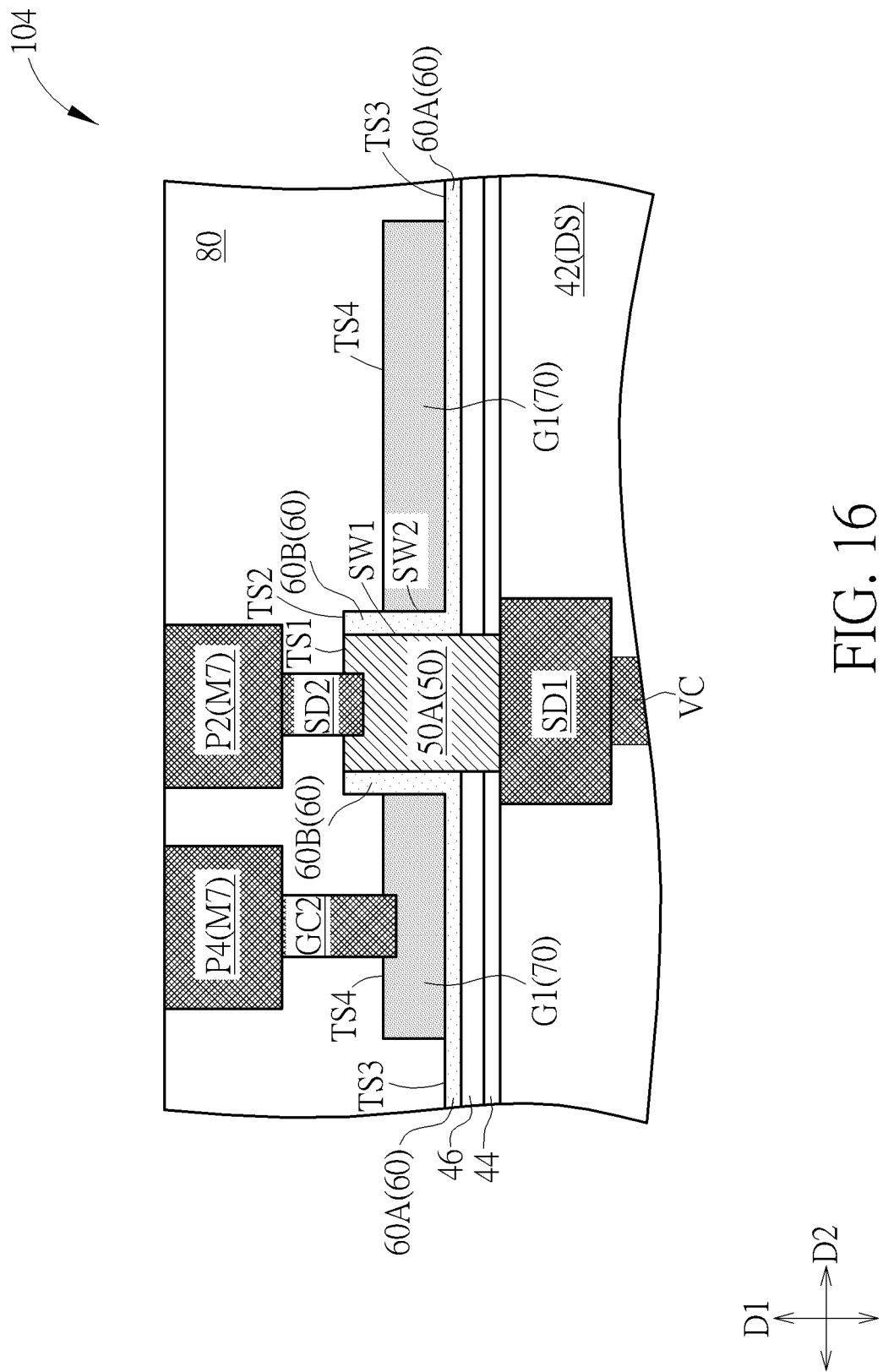
FIG. 16 is a schematic drawing illustrating a semiconductor device according to a fourth embodiment of the present invention.

Please refer to FIG. 16. FIG. 16 is a schematic drawing illustrating a semiconductor device 104 according to a fourth embodiment of the present invention. As shown in FIG. 16, in the semiconductor device 104, the first gate electrode G1 may surround the oxide semiconductor layer 50A and the second portion 60B of the gate dielectric layer 60 in the horizontal direction (such as the second direction D2 shown in FIG. 16 and other directions orthogonal to the first direction D1), and the transistor formed with the oxide semiconductor layer 50A, the first source/drain electrode SD1, the second source/drain electrode SD2, the gate dielectric layer 60, and the first gate electrode G1 may be regarded as a vertical surrounding gate transistor, but not limited thereto.

Figure 17:
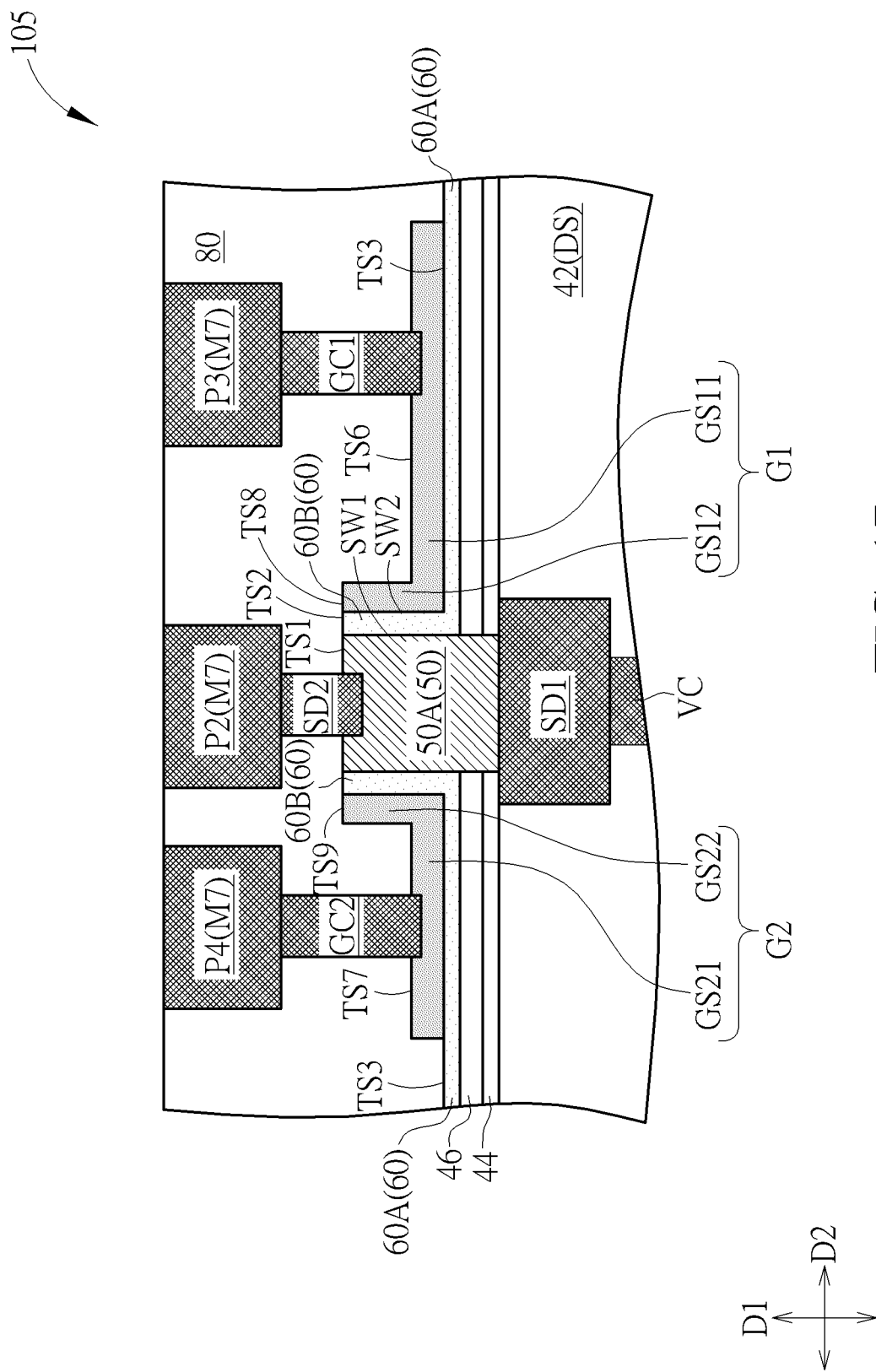
FIG. 17 is a schematic drawing illustrating a semiconductor device according to a fifth embodiment of the present invention.

Please refer to FIG. 17. FIG. 17 is a schematic drawing illustrating a semiconductor device 105 according to a fifth embodiment of the present invention. As shown in FIG. 17, in the semiconductor device 105, the first gate electrode G1 and the second gate electrode G2 may be conformally formed on the top surface TS3 of the first portion 60A of the gate dielectric layer 60 and the sidewall SW2 of the second portion 60B of the gate dielectric layer 60. For example, the first gate electrode G1 may include a first portion GS11 and a second portion GS12 connected with the first portion GS11, and the second gate electrode G2 may include a first portion GS21 and a second portion GS22 connected with the first portion GS21. The first portion GS11 and the first portion GS21 may be elongated in the horizontal direction (such as the second direction D2) respectively, and the second portion GS12 and the second portion GS22 may be elongated in the first direction D1. A top surface TS6 of the first portion GS11 may be lower than a top surface TS8 of the second portion GS12 in the first direction D1, and a top surface TS7 of the first portion GS21 may be lower than a top surface TS9 of the second portion GS22 in the first direction D1. The top surface TS8 of the second portion GS12, the top surface TS9 of the second portion GS22, the top surface TS2 of the second portion 60B of the gate dielectric layer 60, and the top surface TS1 of the oxide semiconductor layer 50A may be substantially coplanar. In some embodiments, the top surface TS6, the top surface TS7, the top surface TS8, and the top surface TS9 may be the topmost surfaces of the corresponding parts in the first direction D1 respectively. In addition, the structural design of the first gate electrode G1 and the second gate electrode G2 in this embodiment may also be applied in other embodiments of the present invention according to some design considerations.

To summarize the above descriptions, in the semiconductor device and the manufacturing method thereof according to the present invention, the source/drain electrodes are disposed at two opposite sides of the oxide semiconductor layer in the vertical direction for forming the vertical transistor structure. In addition, some of the processes of forming the interconnection structure may be used to form the two source/drain electrodes disposed at two opposite sides in the vertical direction for reducing the amount of the required photomasks, and the purposes of reducing the manufacturing cost and/or simplifying the related processes may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a dielectric structure;
   a first source/drain electrode disposed in the dielectric structure;
   an oxide semiconductor layer disposed on the first source/drain electrode in a vertical direction;
   a second source/drain electrode disposed on the oxide semiconductor layer in the vertical direction;
   a gate dielectric layer disposed on the dielectric structure and surrounding the oxide semiconductor layer in a horizontal direction, wherein the gate dielectric layer comprises:
      a first portion elongated in the horizontal direction; and
      a second portion disposed on the first portion and elongated in the vertical direction; and
   a first gate electrode disposed on the first portion of the gate dielectric layer.

2. The semiconductor device according to claim 1, wherein a part of the second portion of the gate dielectric layer is disposed between the first gate electrode and the oxide semiconductor layer in the horizontal direction, and a part of the first portion of the gate dielectric layer is disposed between the first gate electrode and the dielectric structure in the vertical direction.

3. The semiconductor device according to claim 1, wherein a top surface of the second portion of the gate dielectric layer is higher than a top surface of the first portion of the gate dielectric layer in the vertical direction.

4. The semiconductor device according to claim 1, wherein the first gate electrode is disposed on a top surface of the first portion of the gate dielectric layer, and a top surface of the first gate electrode is lower than a top surface of the second portion of the gate dielectric layer in the vertical direction.

5. The semiconductor device according to claim 1, wherein the first gate electrode is disposed on a top surface of the first portion of the gate dielectric layer, and a top surface of the first gate electrode and a top surface of the second portion of the gate dielectric layer are coplanar.

6. The semiconductor device according to claim 1, further comprising:
   a second gate electrode disposed on the first portion of the gate dielectric layer, wherein the first gate electrode and the second gate electrode are disposed at two opposite sides of the oxide semiconductor layer respectively, and the second gate electrode is separated from the first gate electrode.

7. The semiconductor device according to claim 6, wherein a part of the second portion of the gate dielectric layer is disposed between the first gate electrode and the oxide semiconductor layer in the horizontal direction, and another part of the second portion of the gate dielectric layer is disposed between the second gate electrode and the oxide semiconductor layer in the horizontal direction.

8. The semiconductor device according to claim 6, wherein a part of the first portion of the gate dielectric layer is disposed between the first gate electrode and the dielectric structure in the vertical direction, and another part of the first portion of the gate dielectric layer is disposed between the second gate electrode and the dielectric structure in the vertical direction.

9. The semiconductor device according to claim 1, further comprising:
   a dielectric layer disposed on the dielectric structure and the first source/drain electrode, wherein the dielectric layer is disposed between the dielectric structure and the gate dielectric layer in the vertical direction, and the oxide semiconductor layer penetrates through the dielectric layer in the vertical direction.

10. The semiconductor device according to claim 1, further comprising:
    a semiconductor substrate, wherein the dielectric structure is disposed on the semiconductor substrate; and
    an interconnection structure, wherein at least a part of the interconnection structure is disposed in the dielectric structure, and the first source/drain electrode is electrically connected with the interconnection structure.

11. The semiconductor device according to claim 10, wherein the interconnection structure penetrates through the first portion of the gate dielectric layer in the vertical direction.

12. The semiconductor device according to claim 1, wherein the oxide semiconductor layer comprises:
    a first layer; and
    a second layer disposed on the first layer, wherein a part of the first layer is disposed between the second layer and the first source/drain electrode in the vertical direction, and another part of the first layer is disposed between the second layer and the gate dielectric layer in the horizontal direction.

13. The semiconductor device according to claim 12, wherein a material composition of the first layer is different from a material composition of the second layer.

14. The semiconductor device according to claim 12, wherein the first layer comprises a U-shaped structure in a cross-sectional view of the oxide semiconductor layer.

15. The semiconductor device according to claim 1, wherein the first gate electrode surrounds the oxide semiconductor layer and the gate dielectric layer in the horizontal direction.

16. A manufacturing method of a semiconductor device, comprising:
    forming a first source/drain electrode in a dielectric structure;
    forming an oxide semiconductor layer on the first source/drain electrode in a vertical direction;
    forming a gate dielectric layer on the dielectric structure, wherein the gate dielectric layer surrounds the oxide semiconductor layer in a horizontal direction, and the gate dielectric layer comprises:
        a first portion elongated in the horizontal direction; and
        a second portion disposed on the first portion and elongated in the vertical direction;
    forming a first gate electrode on the first portion of the gate dielectric layer; and
    forming a second source/drain electrode on the oxide semiconductor layer in the vertical direction.

17. The manufacturing method of the semiconductor device according to claim 16, wherein a method of forming the oxide semiconductor layer comprises:
    forming a first dielectric layer on the dielectric structure and the first source/drain electrode;
    forming a second dielectric layer on the first dielectric layer;
    forming an opening penetrating through the first dielectric layer and the second dielectric layer in the vertical direction and exposing a part of the first source/drain electrode; and
    forming the oxide semiconductor layer in the opening.

18. The manufacturing method of the semiconductor device according to claim 17, wherein the method of forming the oxide semiconductor layer further comprises:
    removing at least a part of the second dielectric layer before the step of forming the gate dielectric layer for exposing a sidewall of the oxide semiconductor layer, wherein the second portion of the gate dielectric layer is formed on the sidewall of the oxide semiconductor layer.

19. The manufacturing method of the semiconductor device according to claim 16, further comprising:
    forming a second gate electrode on the first portion of the gate dielectric layer, wherein the first gate electrode and the second gate electrode are disposed at two opposite sides of the oxide semiconductor layer respectively, and the second gate electrode is separated from the first gate electrode.

20. The manufacturing method of the semiconductor device according to claim 19, wherein the first gate electrode and the second gate electrode are formed concurrently by performing a patterning process to a gate material layer formed on the gate dielectric layer.

* * * * *